US007794612B2

(12) United States Patent
Chin et al.

(10) Patent No.: US 7,794,612 B2
(45) Date of Patent: Sep. 14, 2010

(54) METHOD OF MANUFACTURING A DISPLAY SUBSTRATE

(75) Inventors: Hong-Kee Chin, Gyeonggi-do (KR); Sang-Gab Kim, Seoul (KR); Min-Seok Oh, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 774 days.

(21) Appl. No.: 11/698,483

(22) Filed: Jan. 25, 2007

(65) Prior Publication Data
US 2007/0170145 A1 Jul. 26, 2007

(30) Foreign Application Priority Data
Jan. 26, 2006 (KR) ............... 10-2006-0008496

(51) Int. Cl.
*B29D 11/00* (2006.01)
(52) U.S. Cl. .................. 216/24; 216/23; 257/66; 349/141
(58) Field of Classification Search ............ 216/23, 216/24; 349/141; 257/66
See application file for complete search history.

(56) References Cited

U.S. PATENT DOCUMENTS

2006/0097261 A1* 5/2006 Yang ..................... 257/66
2006/0262263 A1* 11/2006 Yang et al. ............. 349/141

* cited by examiner

*Primary Examiner*—Nadine G Norton
*Assistant Examiner*—Mahmoud Dahimene
(74) *Attorney, Agent, or Firm*—Innovation Counsel LLP

(57) ABSTRACT

A method of manufacturing a display substrate includes forming a first metallic pattern including gate and storage conductors and a gate electrode of a switching device on a base substrate, forming a gate insulation layer, forming a second metallic pattern and a channel portion including a source line, source and drain electrodes of the switching device, forming a passivation layer and a photoresist film on the second metallic pattern, patterning the photoresist film to form a first pattern portion corresponding to the gate and source conductors and the switching device, and a second pattern portion formed on the storage line, etching the passivation layer and the gate insulation layer, and forming a pixel electrode using the first pattern portion. Therefore, excessive etching of the stepped portion may be prevented, so that a short-circuit defect between a metallic pattern and a pixel electrode may be prevented.

10 Claims, 19 Drawing Sheets

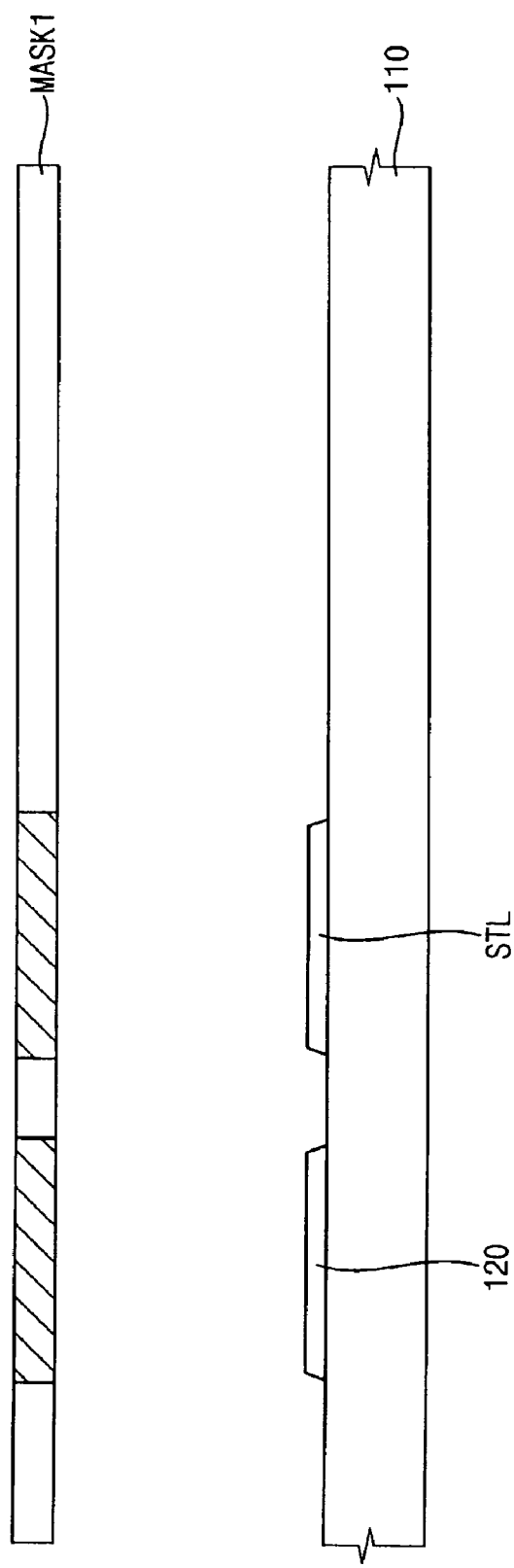

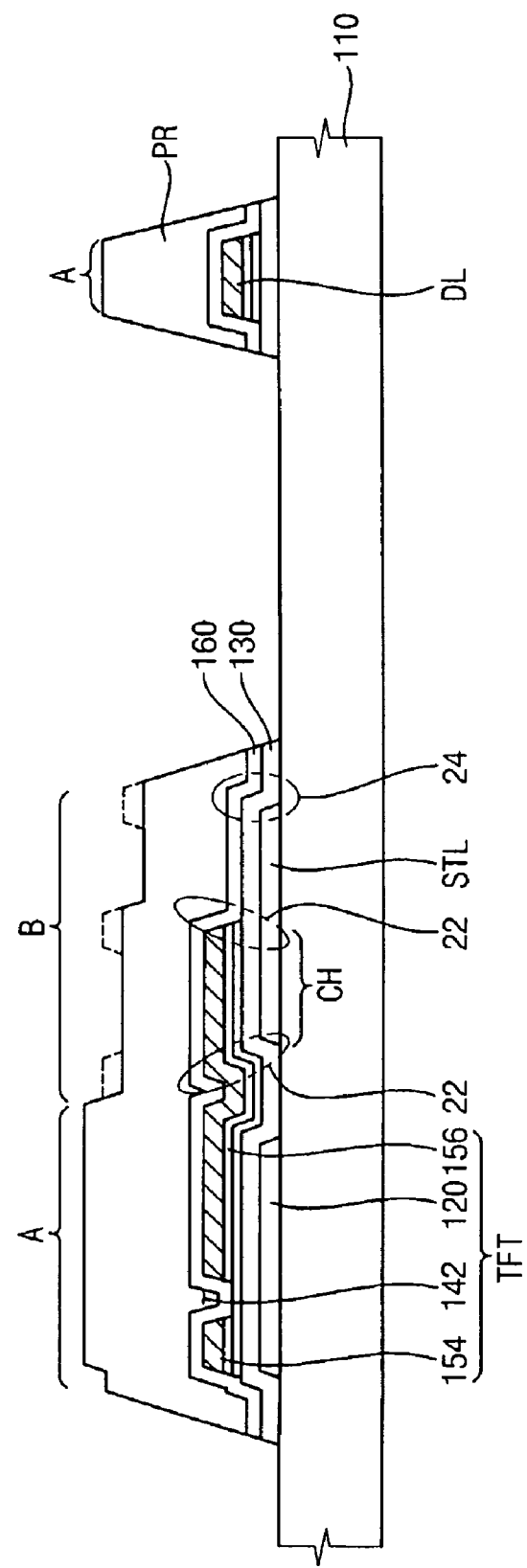

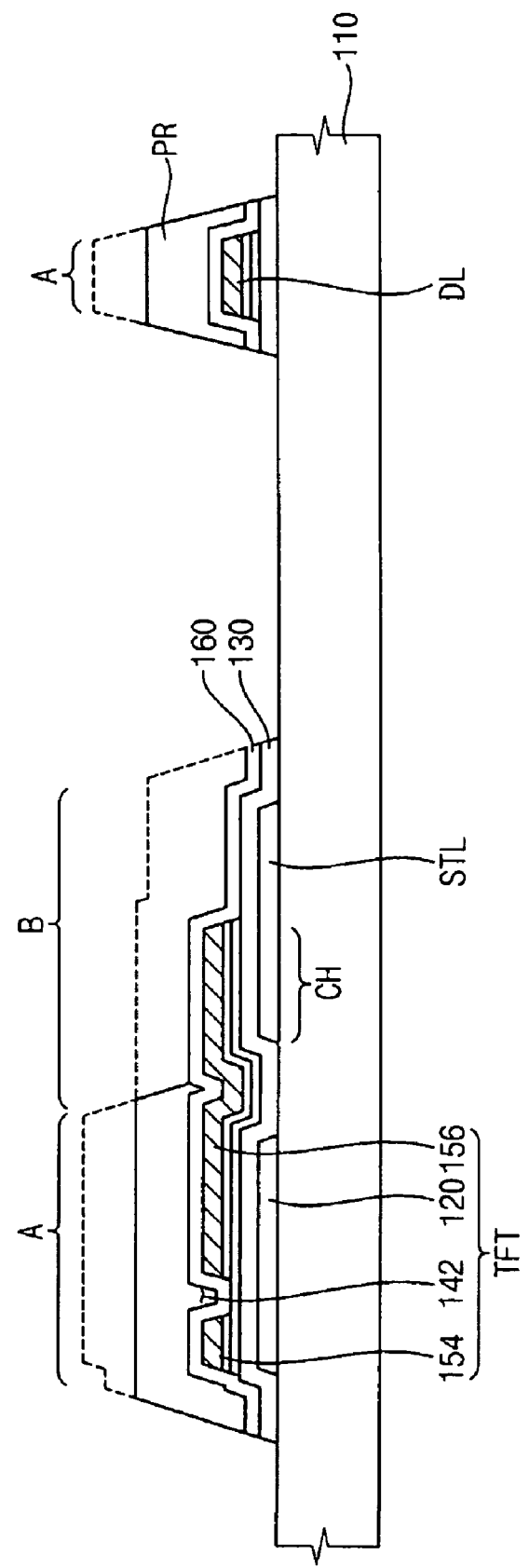

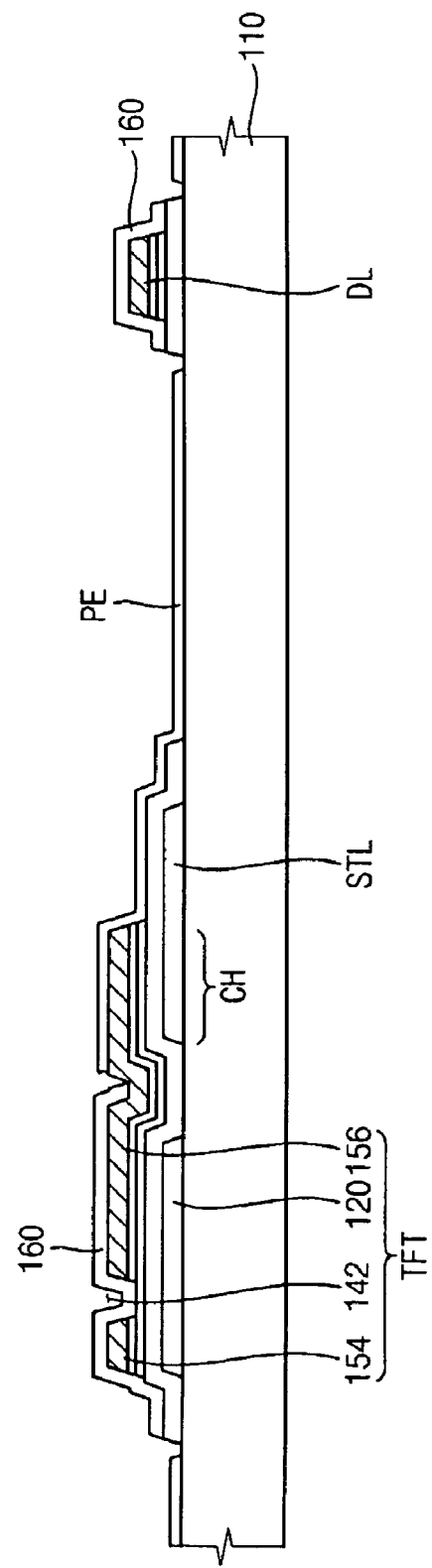

METHOD OF MANUFACTURING A DISPLAY SUBSTRATE

CROSS-REFERENCE TO RELATED APPLICATIONS

This application claims priority of Korean Patent Application No. 2006-8496 filed on Jan. 26, 2006, the contents of which are herein incorporated by reference.

FIELD OF THE INVENTION

The present invention relates to a method of manufacturing a display substrate and, more particularly, to a method of manufacturing a display substrate that prevents short-circuit defects.

DESCRIPTION OF THE RELATED ART

A flat panel display device includes a display substrate having a plurality of generally parallel gate conductors and a plurality of source conductors crossing the gate conductors. Each pixel is formed in a region defined by a gate conductor, a source conductor, and a pixel electrode. A switching device applying a pixel voltage to the pixel electrode is provided for each pixel. The gate conductors, the source conductors and the switching devices are formed through a photolithography process using an exposure mask. A passivation layer that covers the switching device is patterned through a dry etching process. However, as the size of the liquid crystal display (LCD) apparatus becomes larger, a higher etching ratio is required in the dry etching process in order to increase a process margin. However this may cause a portion of the passivation layer covering the switching device to be over-etched thereby exposing a metallic pattern under the passivation layer and causing a short-circuit defect between the pixel electrode and the metallic pattern.

SUMMARY OF THE INVENTION

The present invention provides a method of manufacturing a display substrate to prevent a short-circuit defect between a pixel electrode and a metallic pattern by preventing a passivation layer from being excessively etched. In one aspect of the present invention, a method of manufacturing a display substrate includes forming a first metallic pattern including the gate lines, storage electrodes and the gate electrode of the switching device on a base substrate; forming a gate insulation layer, a channel layer and a source metallic layer on the base substrate including the first metallic pattern; patterning the source metallic layer and the channel layer to form a second metallic pattern and a channel part including a source line, a source electrode of the switching device and a drain electrode of the switching device; forming a passivation layer and a photoresist film on the second metallic pattern; patterning the photoresist film to form a first pattern portion corresponding to the gate line, the source line and the switching device, and a second pattern portion formed on the storage line, a portion of the second pattern portion corresponding to a stepped portion of the storage line being thicker than a remaining portion of the second pattern portion; etching the passivation layer and the gate insulation layer using the first pattern portion and the second pattern portion; and forming a pixel electrode using the first pattern portion.

BRIEF DESCRIPTION OF THE DRAWINGS

The above and other advantages of the present invention will become more apparent from a reading of the ensuing description together with the accompanying drawing, in which:

FIG. 1B is a cross-sectional view taken along the line I-I' shown in FIG. 1A;

FIG. 7 is a cross-sectional view illustrating a process for hardening the base substrate shown in FIG. 6B;

FIG. 8B is a cross-sectional view taken along the line V-V' shown in FIG. 8A;

FIG. 11B is a cross-sectional view taken along the line VI-VI' shown in FIG. 11A.

DESCRIPTION OF THE EMBODIMENTS

Figure 1A:
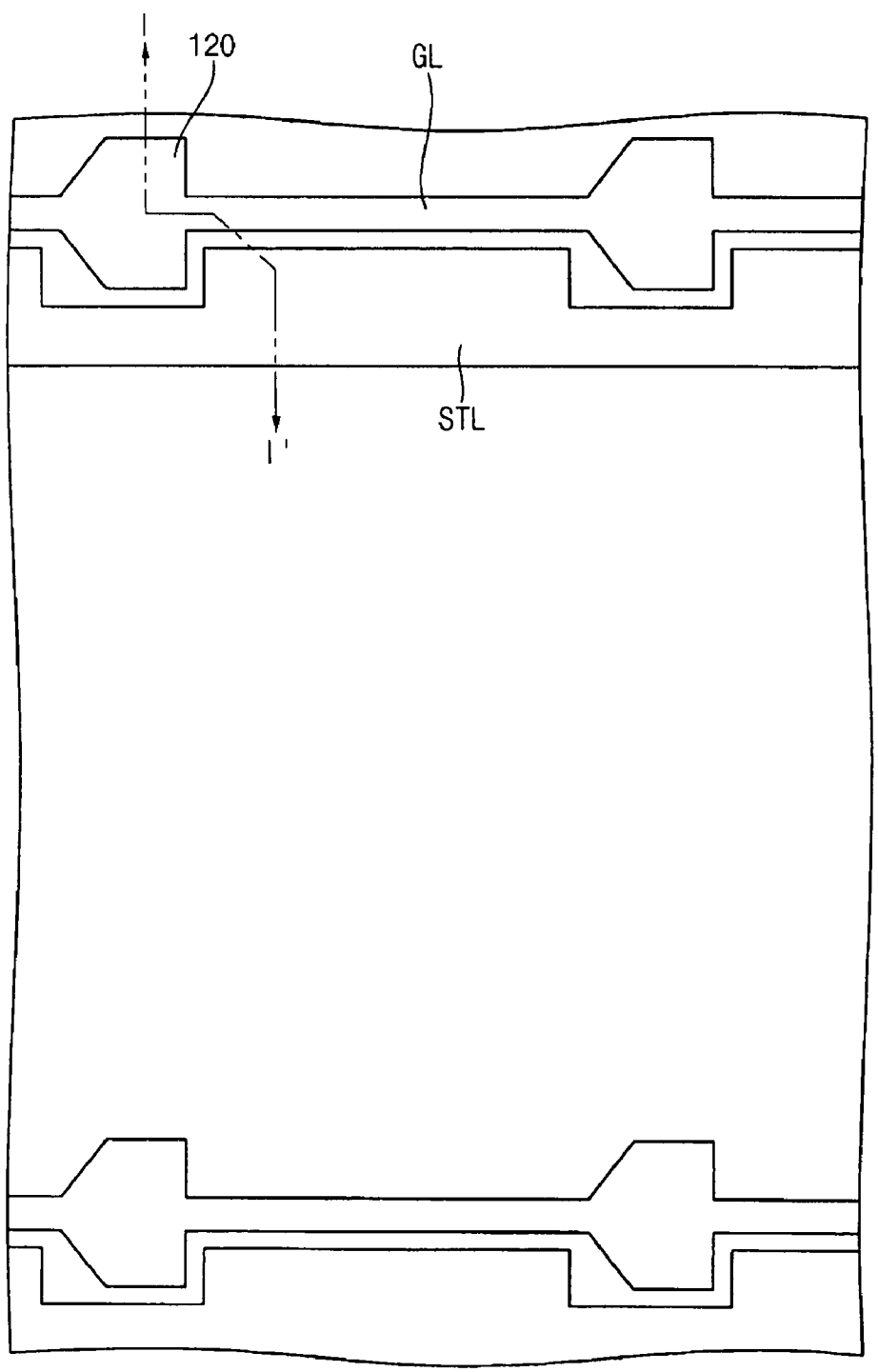
FIGS. 1A, 3A, 4A, 6A, 8A and 11A are plan views illustrating a method of manufacturing a display substrate in accordance with one embodiment of the present invention.

Referring to FIGS. 1A and 1B, a metallic layer (not shown) is formed on a base substrate 110 having a transparent material that transmits light. Examples of a metal that can be used for the metallic layer include chromium, aluminum, tantalum, molybdenum, titanium, tungsten, copper, silver, etc. These can be used alone, in an alloy thereof or in a combination thereof. The metal may be deposited on the base substrate 110 by a sputtering process. Moreover, the metallic layer may have a multilayered structure including a plurality of layers having different physical characteristics. The metallic layer (not shown) is etched using a first mask to form a first metallic pattern. The first metallic pattern includes gate line GL, a gate electrode 120 electrically connected to gate line GL and a storage line STL.

Gate line GL is extended in a first direction, and the storage line STL is extended in the first direction between adjacent gate lines GL.

Figure 2:
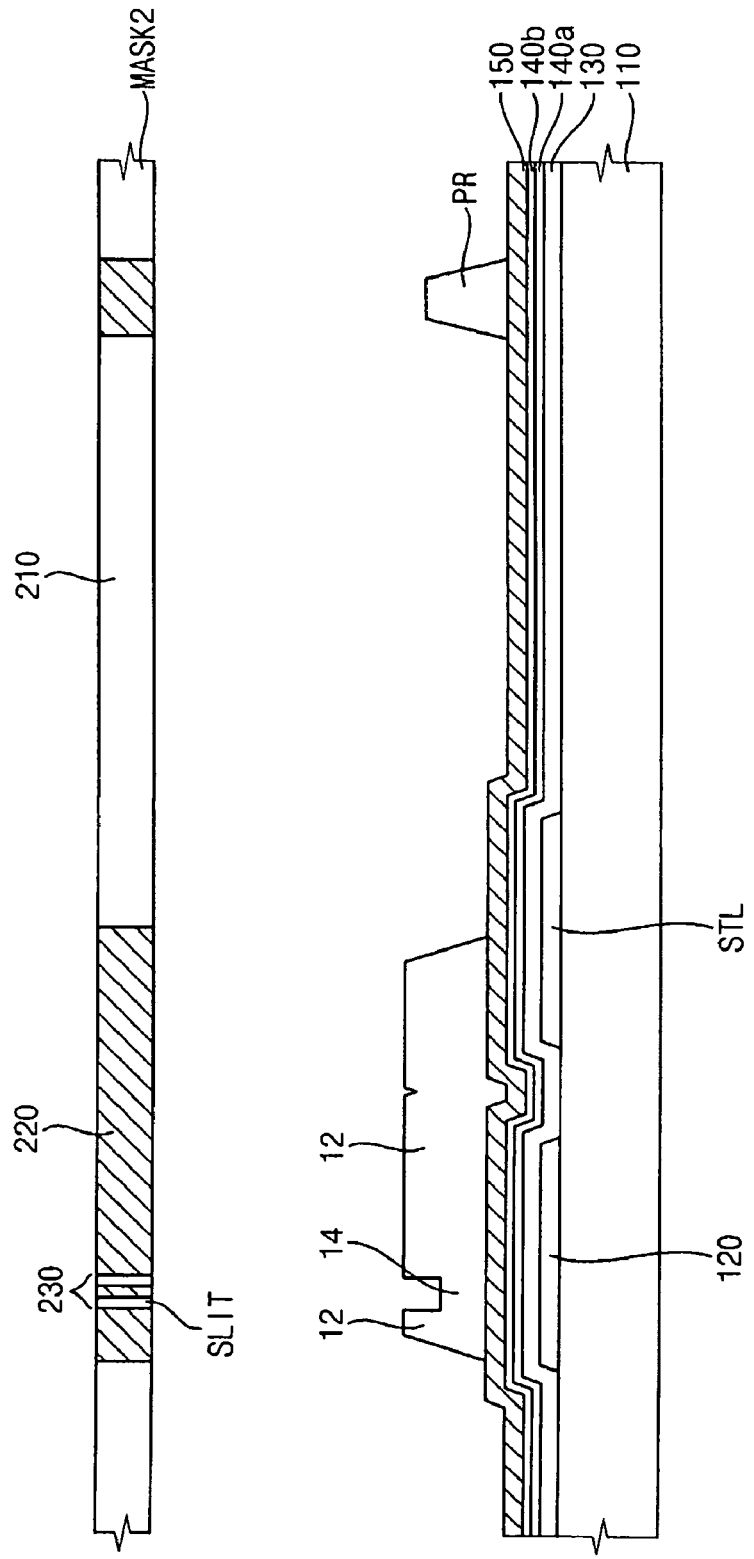
FIG. 2 is a cross-sectional view illustrating a process for forming a gate insulation layer, an active layer, an ohmic contact layer, a metallic layer, and a photoresist film on the base substrate shown in FIG. 1B.

FIG. 2 is a cross-sectional view illustrating a process for forming a gate insulation layer, an active layer, an ohmic contact layer, a metallic layer, and a photoresist film on the base substrate shown in FIG. 1B.

Referring to FIG. 2, a gate insulation layer 130 having silicon nitride (SiNx) is formed on the base substrate 110 having the first metallic pattern (not shown). Gate insulation layer 130 may be formed by a plasma-enhanced chemical vapor deposition (PECVD) process. An active layer 140a having amorphous silicon (a-Si:H) and an ohmic contact layer 140b having n+ amorphous silicon (n+ a-Si:H) are formed on gate insulation layer 130, in sequence. Active layer 140a and ohmic contact layer 140b may be formed by a PECVD process. Alternatively, n+ impurities may be implanted on an upper portion of active layer 140a to form ohmic contact layer 140b.

A metallic layer 150 is formed on ohmic contact layer 140b. Metallic layer 150 may include a metal such as chromium, aluminum, tantalum, molybdenum, titanium, tungsten, copper, silver, etc., which can be used alone or in an alloy form. Metallic layer 150 may be formed by a sputtering process. Moreover, metallic layer 150 may have a multilayered structure that includes a plurality of layers having different physical characteristics. For example, layer 150 may have a triple-layered structure including a molybdenum layer, an aluminum layer and a molybdenum layer that are deposited on ohmic contact layer 140b, in sequence.

A photoresist film PR is coated on substantially the entire surface of metallic layer 150 and is patterned using a second mask MASK2. The photoresist film PR, for example, may include a positive photoresist. An exposed region of the positive photoresist is removed by a developer solution. The second mask MASK2 includes an opening portion 210, a light-blocking portion 220 and a diffraction portion 230.

The opening portion 210 transmits substantially all of light incident into the opening portion 210. The photoresist film PR corresponding to the opening portion 210 is dissolved by the developer solution. The light-blocking portion 220 blocks light. The photoresist film PR corresponding to the light-blocking portion 220 is not dissolved by the developer solution. A plurality of slit patterns is formed in the diffraction portion 230, and light is diffracted and scattered by the slit patterns. Thus, when the area of the photoresist film PR corresponding to the diffraction portion 230 is developed, photoresist film PR is thinner in the area corresponding to the diffraction portion 230 than in the area corresponding to the light-blocking portion 220.

Therefore, the photoresist film PR corresponding to the light-blocking portion 220 has a first thickness portion 12 and a second thickness portion 14 which is thinner than the first portion 12. Portion 12 corresponds to a source line, a source electrode and a drain electrode of a switching device, and portion 14 corresponds to a channel part of the switching device.

Figure 3A:
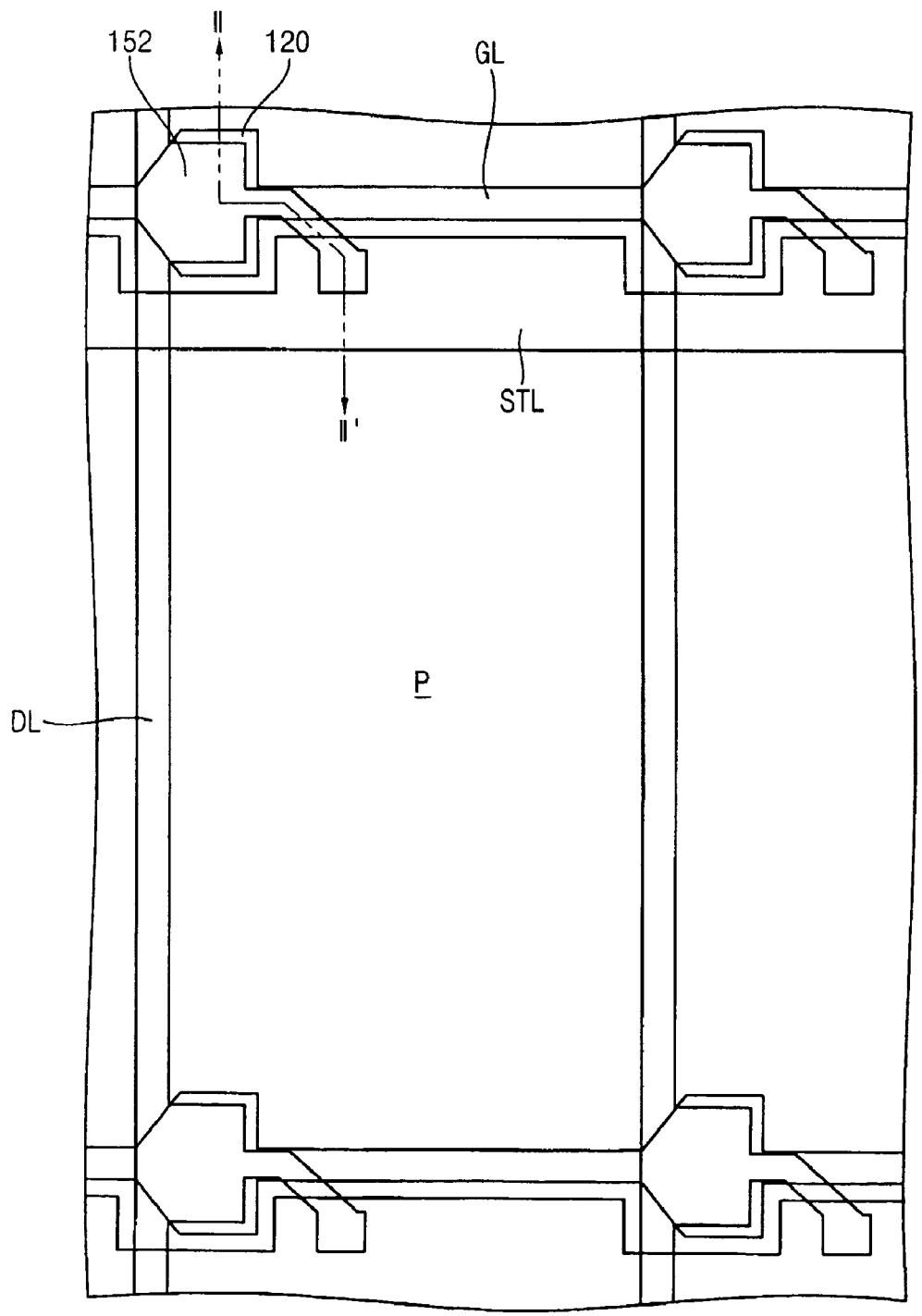
Figure 3B:
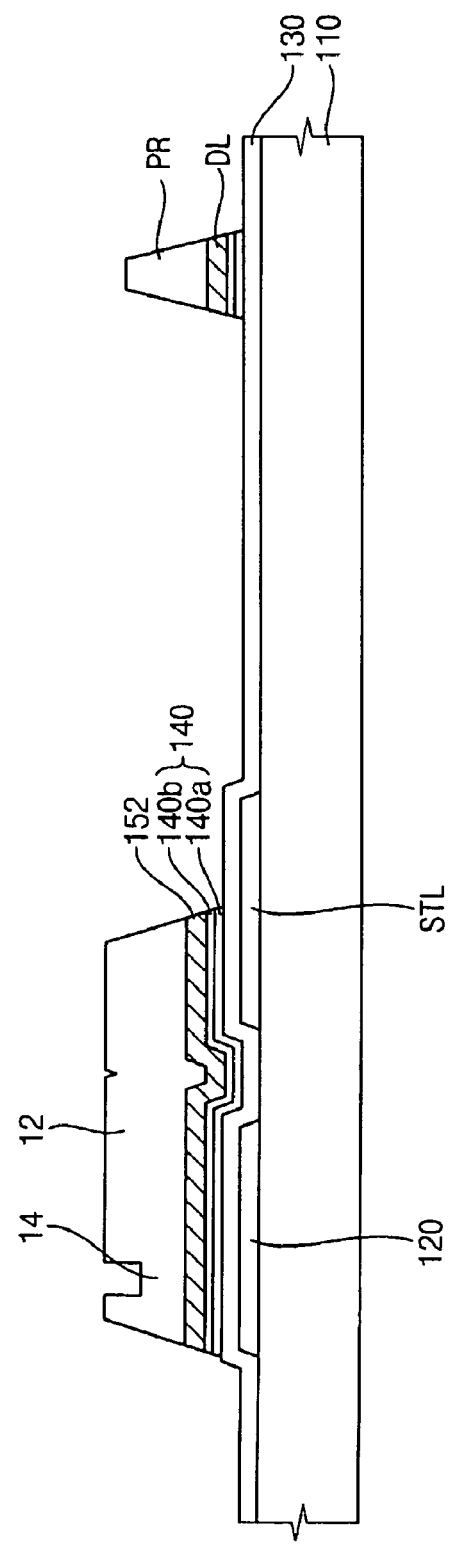
FIG. 3B is a cross-sectional view taken along the line II-II' shown in FIG. 3A.

FIG. 3B is a cross-sectional view taken along the line II-II' shown in FIG. 3A. Referring to FIGS. 3A and 3B, metallic layer 150 is etched through a wet etching process using the first thickness portion 12 and the second thickness portion 14 as an etching mask. Thus, a second metallic pattern is formed. The second metallic pattern includes an electrode pattern 152 and a source line DL. The electrode pattern 152 is partially overlapped by gate electrode 120 and storage line STL. Source line DL is extended in a second direction crossing the first direction. A plurality of pixel portions P is formed on base substrate 110 by gate lines GL extended in the first direction and the source lines DL crossing gate lines GL in the second direction.

Active layer 140a and ohmic contact layer 140b are etched using the second metallic pattern as an etching mask. Active layer 140a and ohmic contact layer 140b, for example, may be etched by a dry etching process. When the dry etching process is completed, a channel layer 140 is formed in a lower portion of the second metallic pattern. Channel layer 140 may have substantially the same shape as the second metallic pattern.

Figure 3C:
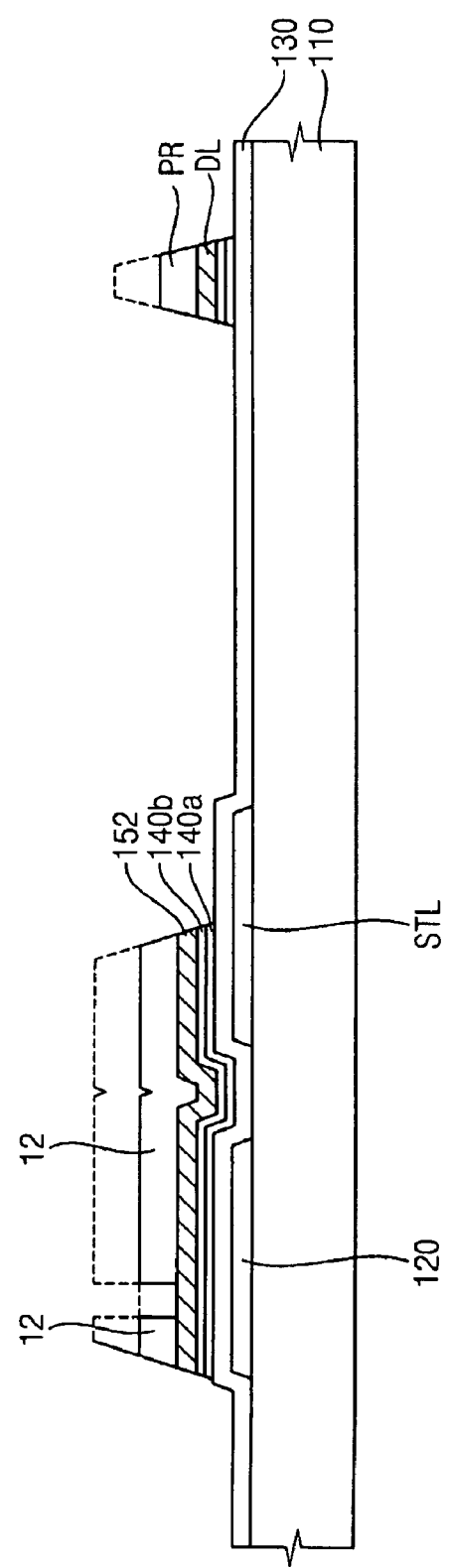
FIG. 3C is a cross-sectional view illustrating a process for ashing the photoresist film shown in FIG. 3B.

FIG. 3C is a cross-sectional view illustrating a process for ashing the photoresist film shown in FIG. 3B. Referring to FIG. 3C, a predetermined thickness of the photoresist film is removed by an oxygen plasma ashing process. The thinner portion 14 is removed, exposing the electrode pattern 152, while the thicker portion 12, having the predetermined thickness, remains covering the electrode pattern.

Figure 4A:
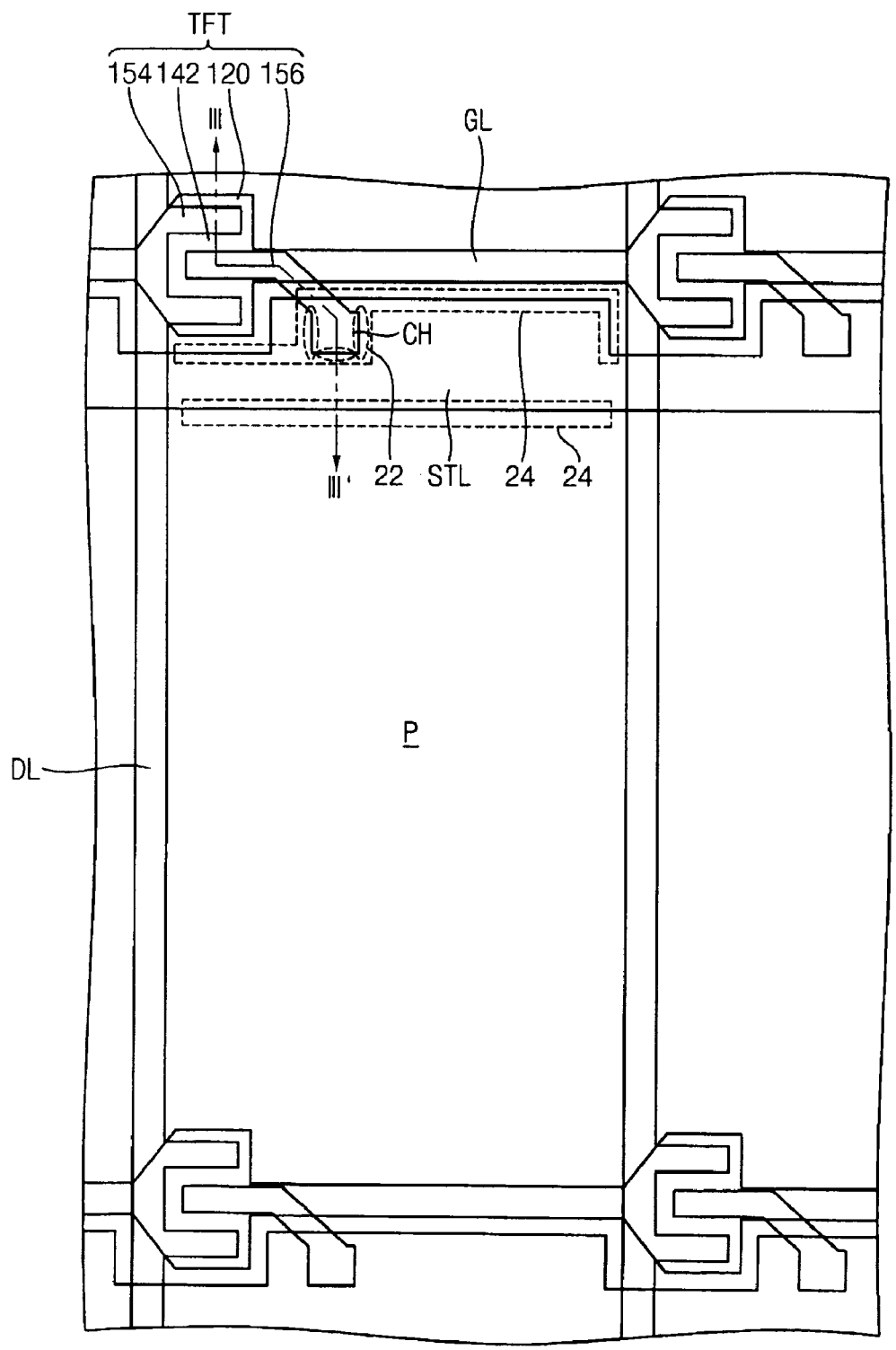
Figure 4B:
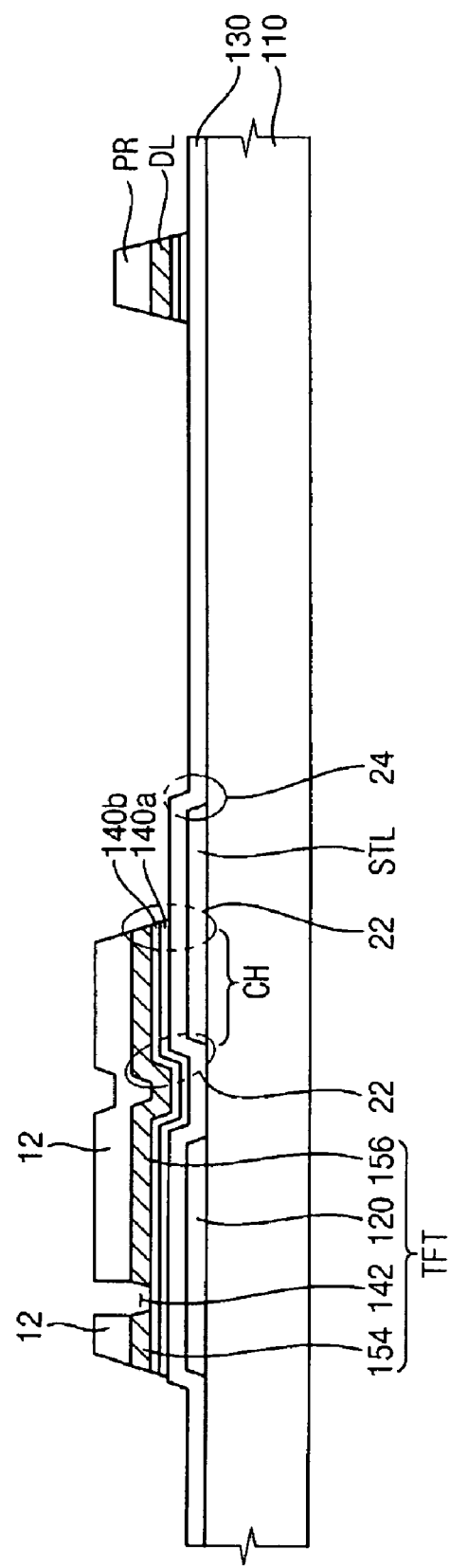
FIG. 4B is a cross-sectional view taken along the line III-III' shown in FIG. 4A.

FIG. 4B is a cross-sectional view taken along the line III-III' shown in FIG. 4A. Referring to FIGS. 4A and 4B, the electrode pattern 152 is etched, for example by a wet etching process, using portion 12 as an etching mask. Thus, a source electrode 154 of the switching device and a drain electrode 156 spaced apart from the source electrode 154 are formed. The drain electrode 156 includes a contact portion CH that overlaps storage line STL. A first stepped portion 22 is formed in an edge area of the overlapped portion between the contact portion CH of the drain electrode 156 and the storage line STL. A second stepped portion 24 is formed between an edge area of the storage line STL and the base substrate 110.

Ohmic contact layer 140b is etched through a dry etching process using the source electrode 154 and the drain electrode 156 as an etching mask. Thus, a channel part 142 is formed. The channel part 142 exposes active layer 140a between source electrode 154 and drain electrode 156. Portion 12 of the photoresist remaining on source electrode 154 and drain electrode 156 is removed by an oxygen plasma ashing process. Thus, a switching device TFT is formed on base substrate 110. The switching device TFT includes the gate electrode 120, the source electrode 154, the drain electrode 156 and the channel part 142.

Figure 5:
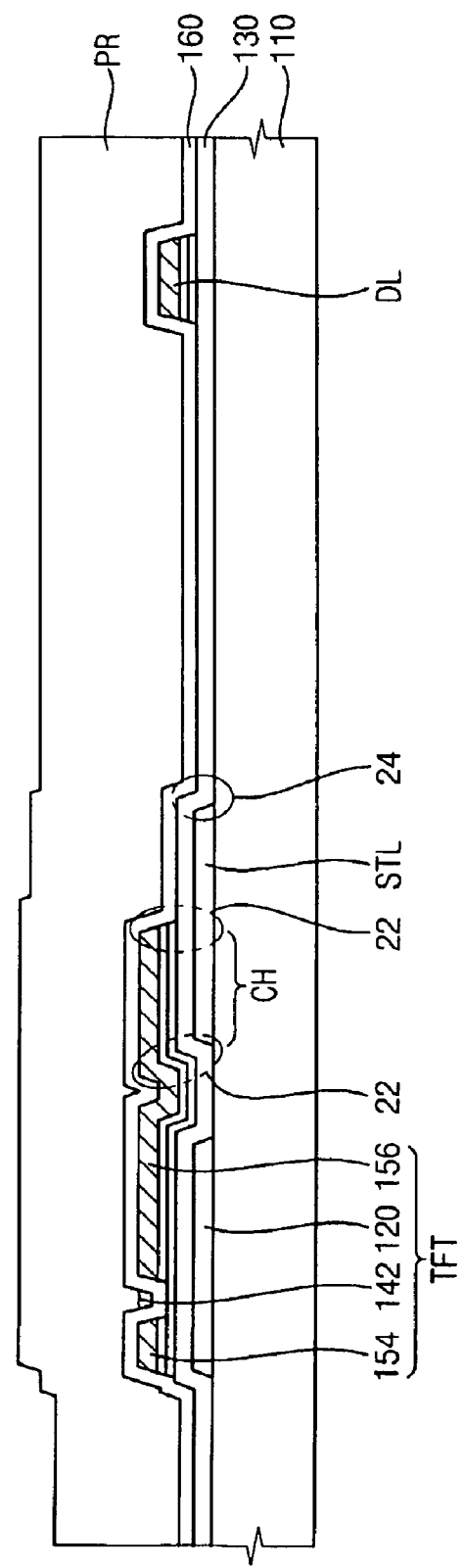
FIG. 5 is a cross-sectional view illustrating a process for forming a passivation layer and a photoresist film on the base substrate shown in FIG. 4B.

FIG. 5 is a cross-sectional view illustrating a process for forming a passivation layer and a photoresist film on the base substrate shown in FIG. 4B. Referring to FIG. 5, a passivation layer 160 and a photoresist film PR are sequentially formed on gate insulation layer 130 having the switching device TFT. Examples of an insulating material that can be used for passivation layer 160 include silicon nitride (SiNx), silicon oxide (SiOx), etc. Passivation layer 160 may be formed by a PECVD process. The photoresist film PR, for example, may include a positive photoresist. The exposure region of the positive photoresist is dissolved by a developer solution.

Figure 6A:
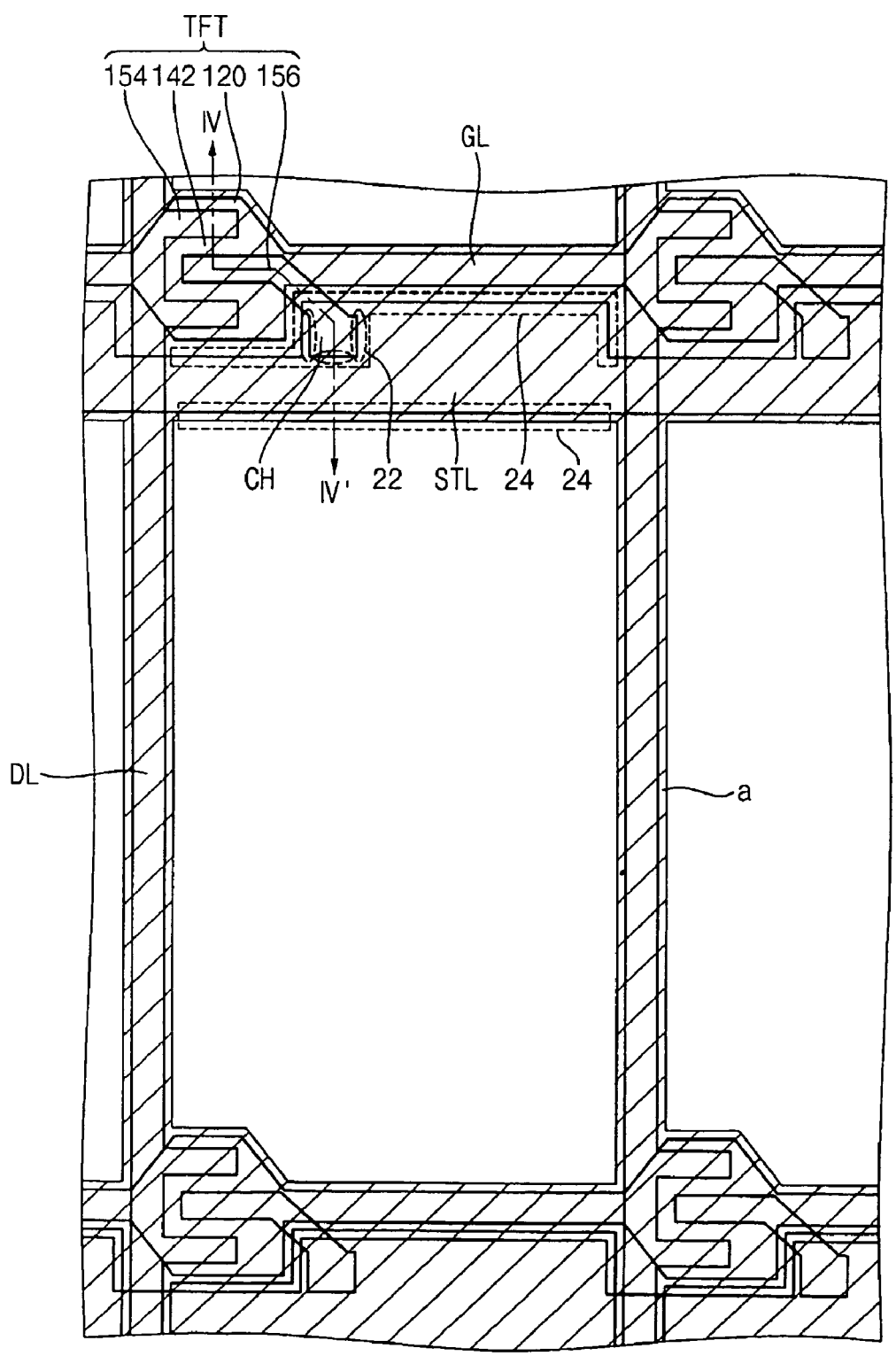
Figure 6B:
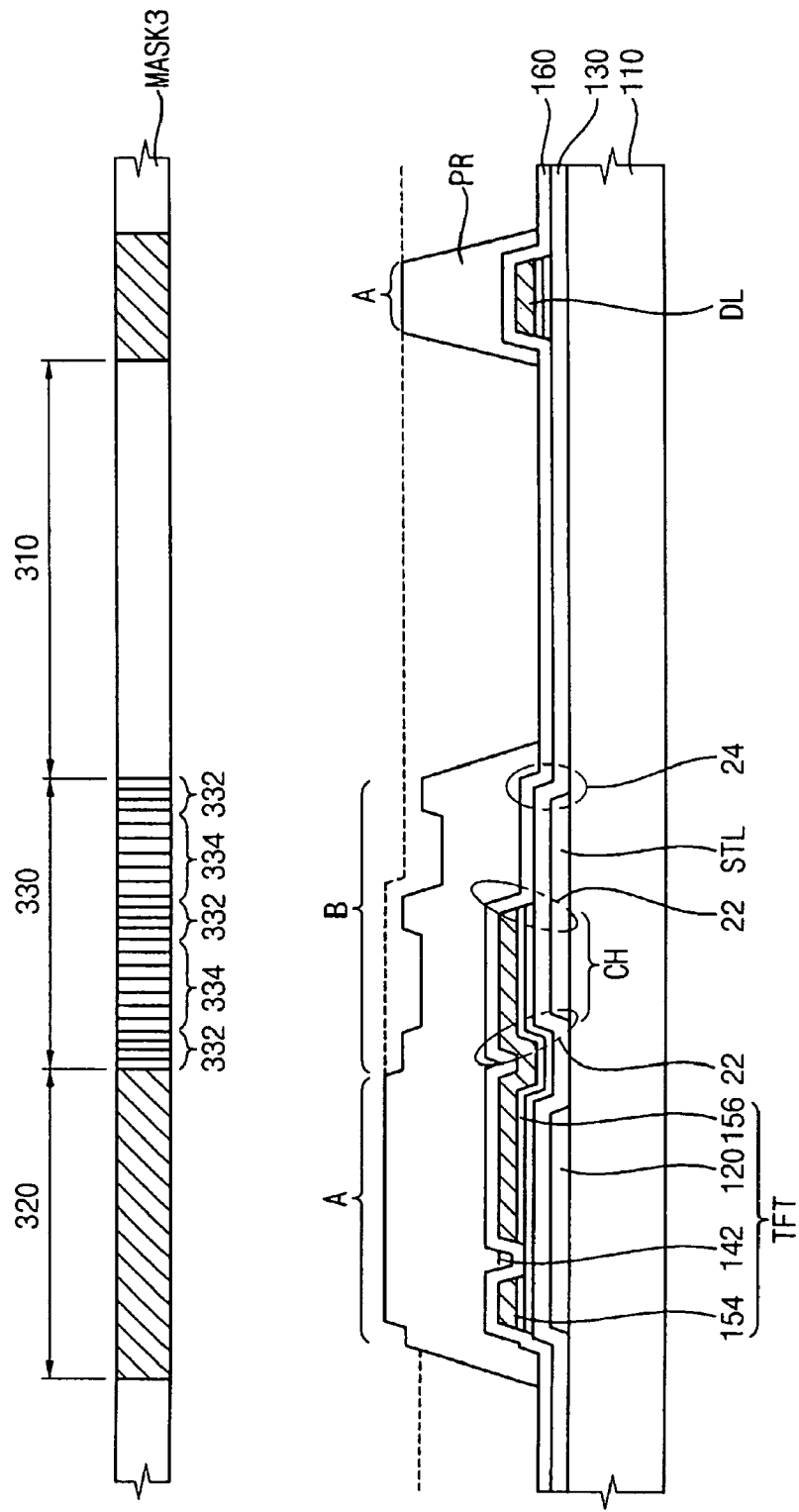
FIG. 6B is a cross-sectional view taken along the line IV-IV' shown in FIG. 6A.

FIG. 6B is a cross-sectional view taken along the line IV-IV' shown in FIG. 6A. Referring to FIGS. 6A and 6B, a third mask MASK3 is arranged on the photoresist film PR. The third mask MASK3 includes an opening portion 310, a light-blocking portion 320 and a diffraction portion 330.

The opening portion 310 excludes the area of the source line DL, gate line GL, the switching device TFT and the storage line STL. The photoresist film PR corresponding to the opening portion 310 is dissolved by a developer solution exposing passivation layer 160 on base substrate 110.

The light-blocking portion 320 corresponds to the source line DL, gate line GL and the switching TFT. When a positive photoresist film PR is used, the portions corresponding to the light-blocking portion 320 are not dissolved by the developer solution. Therefore, when the photoresist film PR is developed, a first pattern part A is formed in a region corresponding to the switching device TFT, the source line DL and gate line GL whose thickness is not changed by the developing process.

The diffraction portion 330 corresponds to the storage line STL. When light passes through the diffraction portion 330, the photoresist film corresponding to the diffraction portion 330 is partially exposed by the diffracted light and the photoresist film corresponding to the diffraction portion 330 is partially dissolved by the developer solution. Thus, a lesser thickness of photoresist film PR remains in part B than in part A.

For example, the diffraction portion 330 includes a first area 332 and a second area 334. A slit pattern having a first width is formed in the first area 332, and a silt pattern having a second width is formed in the second area 334. The first area 332 is disposed correspondingly to the first stepped portion 22 and the second stepped portion 24 formed on the storage line STL. The slit pattern in the first area 332 has a narrower width than the second area 334, so that a light transmission ratio in the first area 332 is lower than that of the second area 334. Thus, when the exposed photoresist film PR is developed, the second pattern part B corresponding to the first stepped portion 22 and the second stepped portion 24 is formed. The second pattern part B has a greater thickness than the first pattern part A. In FIGS. 6A and 6B, the second pattern part B corresponding to the first stepped portion 22 and the second stepped portion 24 has the greater thickness than the first pattern part A to protect the metallic pattern in the first stepped portion 22 and the second stepped portion 24 from being etched during a first and a second dry etching processes mentioned later.

When the photoresist film PR is heated by a hardening process, the photoresist film PR has fluidity. Thus, the photoresist film PR reflows (PR REFLOW). The photoresist film corresponding to the first stepped portion 22 and the second stepped portion 24 flows due to the photoresist reflow (PR REFLOW), so that a thickness of the photoresist film PR corresponding to the first stepped portion 22 and the second stepped portion 24 is decreased. Moreover, the thickness of the photoresist film PR may also be decreased by oxygen gas ($O_2$) in a first dry etching process. Thus, the thickness of the photoresist film PR corresponding to the first stepped portion 22 and the second stepped portion 24 may be decreased two times due to the photoresist reflow and the oxygen gas. Therefore, when the slits of the diffraction portion have substantially the same width and interval, the passivation layer corresponding to the first stepped part and the second stepped part may be exposed by the photoresist reflow and the oxygen gas.

However, in FIGS. 6A and 6B, the photoresist film PR corresponding to the first stepped portion 22 and the second stepped portion 24 is thicker than the remaining portion of the diffraction portion 330, so that passivation layer 160 corresponding to the first stepped portion 22 and the second stepped portion 24 is sufficiently covered by the photoresist film PR, although the photoresist reflow and the oxygen gas are performed on the photoresist film PR. Thus, the exposure of the metallic pattern formed in a lower portion of passivation layer 160 may be prevented, so that a short-circuit defect between a pixel electrode and the metallic pattern may be prevented.

The amount of exposure light in the boundary between the diffraction portion 330 and the opening portion 310 is more than that of the exposure light in a center of the diffraction portion 330. Thus, when the exposed photoresist film is developed, the thickness of the photoresist film PR corresponding to the boundary is decreased. Therefore, the first area 332 having smaller light transmittance than the second area 334 is formed in a portion of the diffraction portion 330 adjacent to the opening portion 310, to compensate for an excessive exposure of the exposure light on the photoresist film PR corresponding to the boundary between the diffraction portion 330 and the opening portion 310.

In FIGS. 6A and 6B, the photoresist film demonstrates the use of a positive photoresist to form the photoresist film. However, a negative photoresist film may be used instead. When negative photoresist film is used, the locations of the opening portion and the light-blocking portion of the third mask are reversed. Moreover, locations of the first area and the second area of the diffraction portion are also reversed.

FIG. 7 is a cross-sectional view illustrating a process for hardening the base substrate shown in FIG. 6B. Referring to FIG. 7, the base substrate 110 having the developed photoresist film PR is heated to perform a hardening process. The photoresist film PR exhibits some fluidity due to the hardening process, thereby performing a photoresist reflow (PR REFLOW). The photoresist film corresponding to the first stepped portion 22 and the second stepped portion 24 flows down due to the photoresist reflow (PR REFLOW). The thickness of the photoresist film PR corresponding to the first stepped portion 22 and the second stepped portion 24 is decreased, so that the second pattern part B may have a uniform thickness.

Passivation layer 160 and gate insulation layer 130 are etched by a first dry etching process using the hardened photoresist film PR as an etching mask. Base substrate 110 is exposed through the etched area of passivation layer 160 and gate insulation layer 130. Examples of an etching gas used for the first dry etching process include sulfur hexafluoride ($SF_6$), carbon tetrafluoride ($CF_4$), etc. The etching may further include the use of oxygen gas ($O_2$) to improve etching uniformity. The oxygen gas ($O_2$) also etches the photoresist film PR. Therefore, a portion of the photoresist film PR is also etched in the first dry etching process. The second pattern part B having the uniform thickness remains on the first stepped portion 22 and the second stepped portion 24 of the storage common pattern STL, so that excessive etching of the first and second stepped portions 22 and 24 by the first dry etching process may be prevented.

Figure 8A:
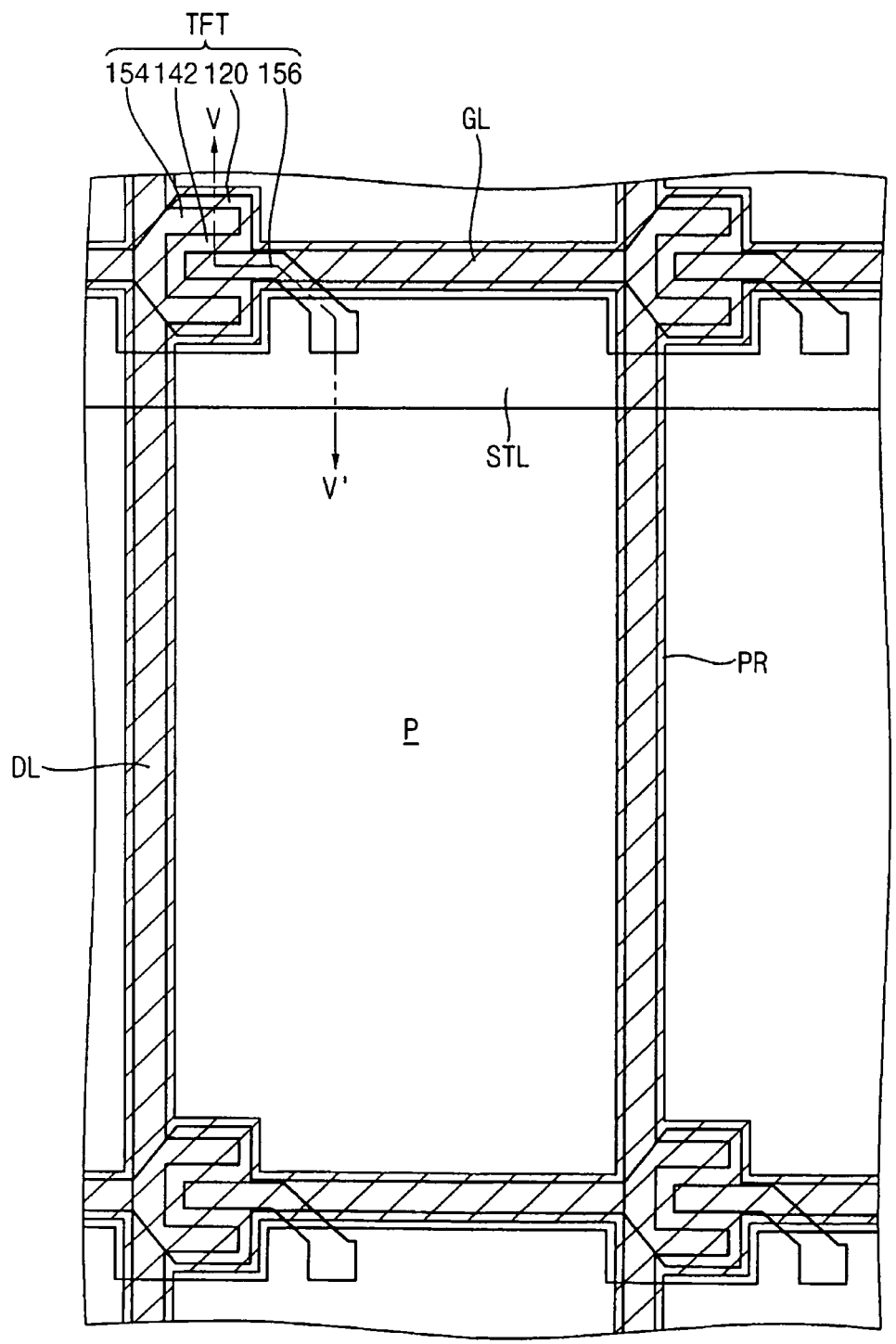

FIG. 8B is a cross-sectional view taken along the line V-V' shown in FIG. 8A. Referring to FIGS. 8A and 8B, a predetermined thickness of photoresist film PR is removed by an oxygen plasma ashing process. Thus, the second pattern part B corresponding to the storage line STL is removed. The second pattern part B has less thickness than the first pattern part A. The first pattern part A corresponding to the source line DL, gate line GL and the switching device TFT remains at a predetermined thickness.

Figure 9:
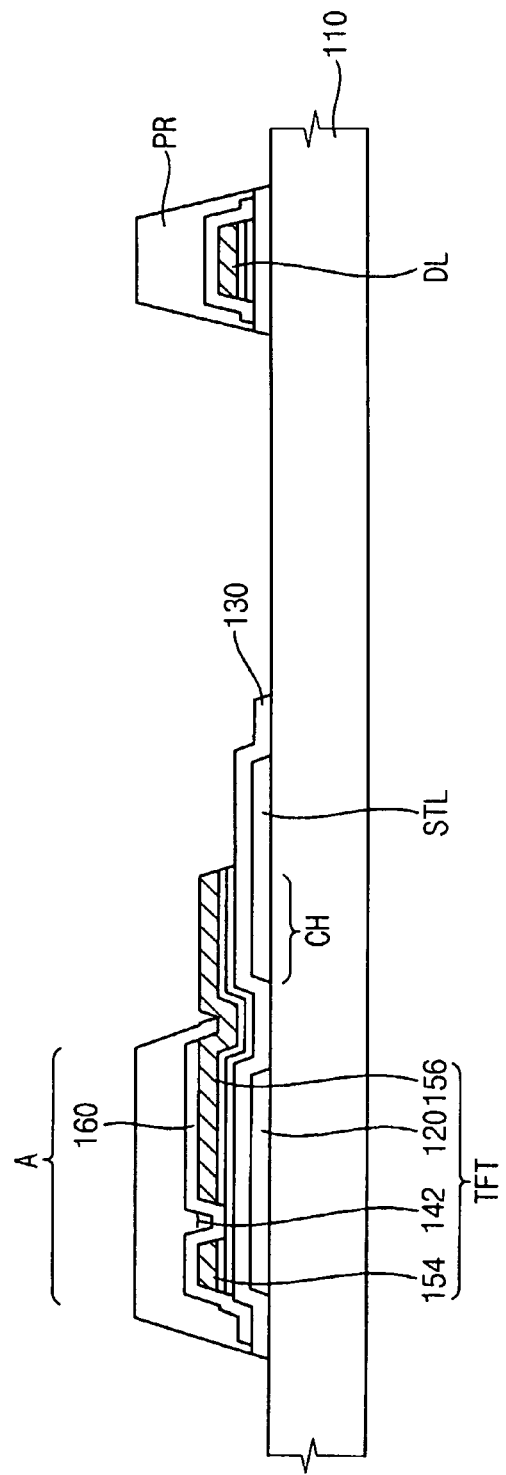
FIG. 9 is a cross-sectional view illustrating a second dry etching process for etching the passivation layer shown in FIG. 8B.

FIG. 9 is a cross-sectional view illustrating a second dry etching process for etching the passivation layer shown in FIG. 8B. Referring to FIG. 9, passivation layer 160 is etched by a second dry etching process using the remaining first pattern part A as an etching mask. Thus, the contact part CH formed on the storage line STL is exposed. The second dry etching process is an isotropic etching, and an undercut is formed in passivation layer 160 under the first pattern part A.

Figure 10:
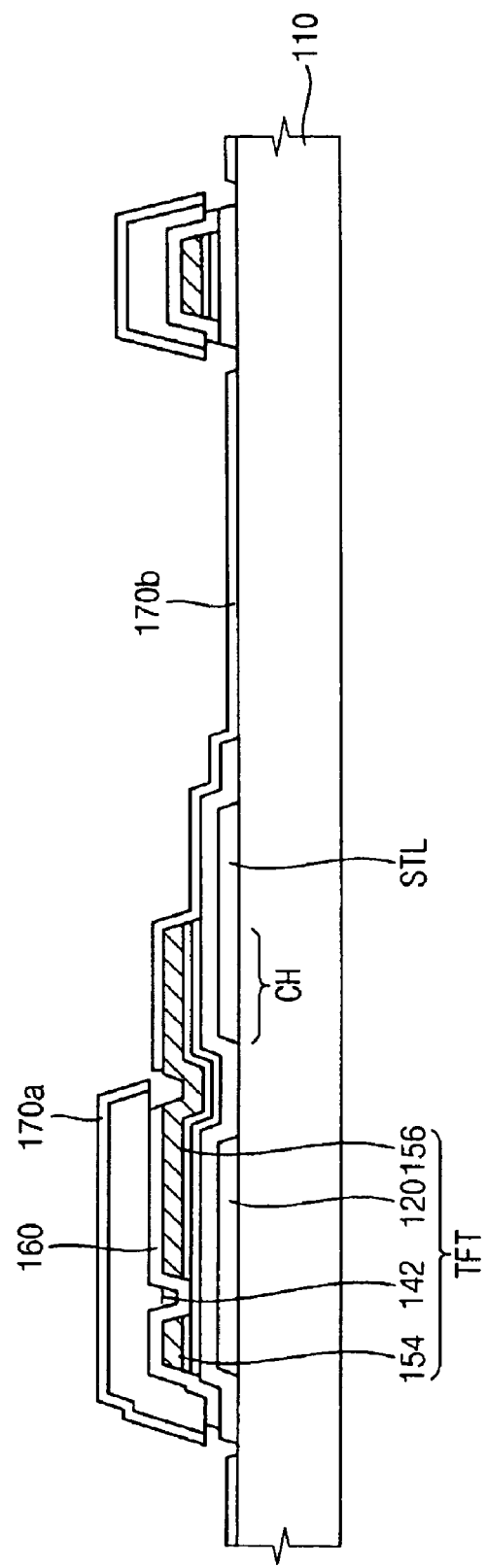
FIG. 10 is a cross-sectional view illustrating a process for forming a conductive transparent layer on the base substrate shown in FIG. 9.

FIG. 10 is a cross-sectional view illustrating a process for forming a conductive transparent layer on the base substrate shown in FIG. 9. Referring to FIG. 10, in order to cover the first pattern part A, a coating layer of transparent conductive material is deposited on base substrate 110. Examples of the transparent conductive material include indium tin oxide (ITO), indium zinc oxide (IZO), etc. Coating layer 170a formed on the first pattern part A and coating layer 170b formed on the base substrate 110 are electrically separated 110 from each other.

Figure 11A:
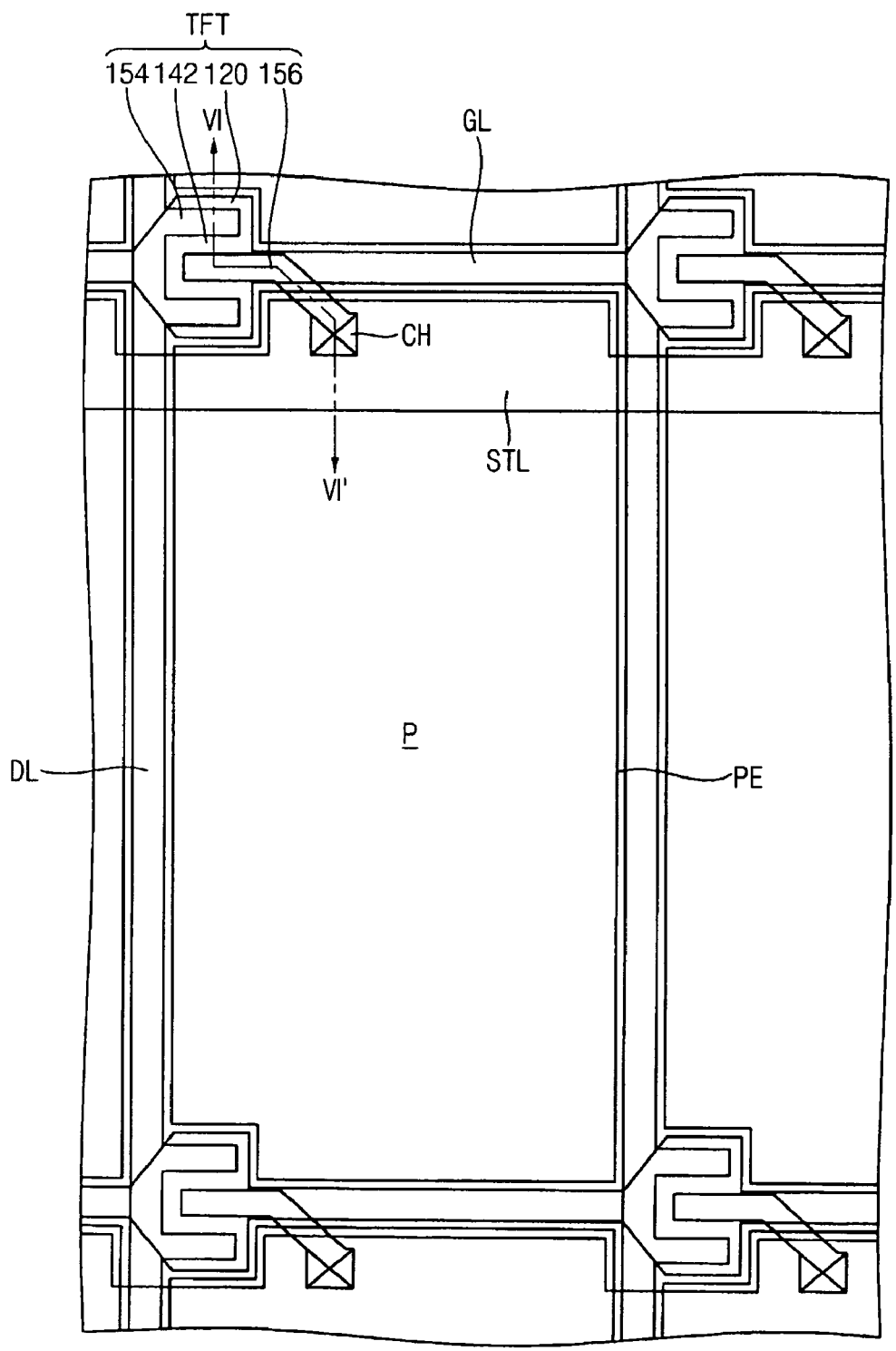

FIG. 11B is a cross-sectional view taken along the line VI-VI' shown in FIG. 11A. Referring to FIGS. 11A and 11B, the base substrate 110 having the first pattern part A is dipped in a photoresist (PR) stripper solution. The PR stripper solution permeates into the first pattern part A through the undercut, and removes the first pattern part A. The coating layer 170a formed on the first pattern part A is removed simultaneously with the first pattern part A.

Referring to FIG. 11B, the pixel electrode PE is formed on the pixel portion P. The pixel electrode PE is electrically connected to the drain electrode 156 through the contact part CH.

Figure 12:
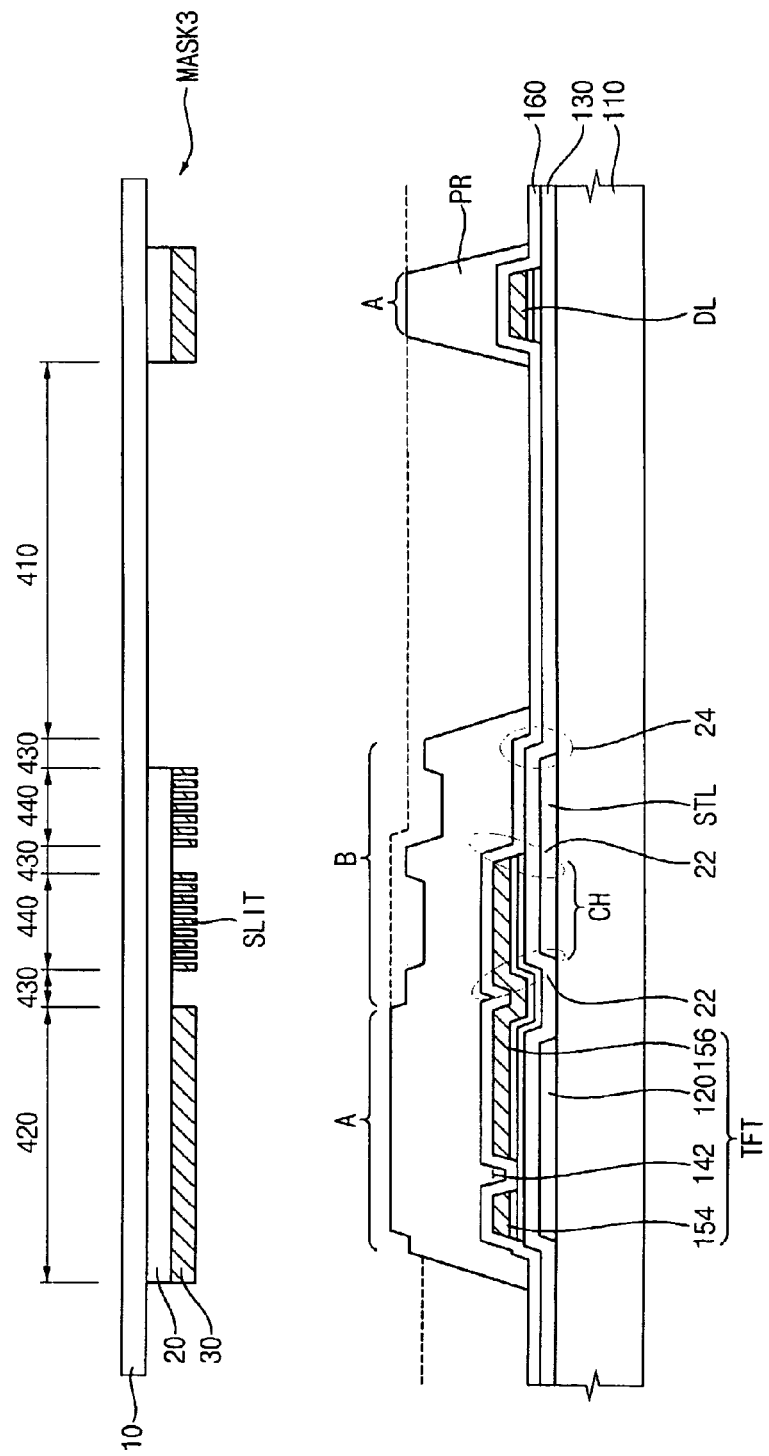
FIG. 12 is a cross-sectional view illustrating an exposing process of FIG. 6B in accordance with another embodiment.

FIG. 12 is a cross-sectional view illustrating an exposing process of FIG. 6B in accordance with another embodiment.

Referring to FIG. 12, the third mask MASK3 includes a transparent substrate 10, a transflective layer 20 and a light-blocking layer 30.

The transparent substrate 10 includes transparent material such as quartz, glass, etc., and transmits substantially all of the incident light that enters from a back side of the third mask MASK3. A transflective layer 20 is deposited on a portion of the transparent substrate 10 and transmits a portion of the light having passed through the transparent substrate 10. Transflective layer 20, for example, may include a transflective material such as molybdenum silicide (MoSi). The light-blocking layer 30 is deposited on a portion of the transflective layer 20, and includes a plurality of silt patterns. The slit patterns diffract the light having passed through the transflective layer 20. The light-blocking layer 30, for example, may include chromium (Cr).

The third mask MASK3 may be divided into a plurality of portions based on light transmissivity. An opening portion 410 is defined as the transparent substrate 10 excluding the transflective layer 20 and the light-blocking layer 30. The opening portion 410 transmits substantially all of the incident light. A transflective portion 430 is defined by the area of the transflective layer 20 of the transparent substrate 10. The transflective portion 430 transmits a portion of the incident light. A diffraction portion 440 is defined by the area in which slit patterns of the light-blocking layer 30 are formed on the transflective layer 20. The diffraction portion 440 diffracts the incident light. Therefore, a light transmission ratio in the diffraction portion 440 is smaller than in the transflective portion 430. A light-blocking portion 420 is defined by an area in which the light-blocking layer 30 is formed. The light-blocking portion 420 blocks substantially all the incident light.

Referring to FIGS. 6A and 12, the opening portion 410 is disposed corresponding to the remaining area excluding the source line DL, gate line GL, the switching device TFT and the storage line STL. A photoresist film PR corresponding to the opening portion 410 is removed by a developer solution, so that passivation layer 160 is exposed on the base substrate 10 in an area corresponding to the opening portion 410.

The light-blocking portion 420 is disposed in an area corresponding to the source line DL, gate line GL and the switching device TFT. Therefore, when the photoresist film PR is developed, the first pattern part A is formed corresponding to the switching device TFT, the source line DL and gate line GL. The thickness of the first pattern part A is not changed by the development process.

The transflective portion 430 corresponds to the storage line STL. The diffraction portion 440 corresponds to the first stepped portion 22 and the second stepped portion 24 formed on the storage line STL. A light transmission ratio of the diffraction portion 440 is smaller than the transflective portion 430. Therefore, when the exposed photoresist film is developed, the second pattern part B is formed corresponding to the first stepped portion 22 and the second stepped portion 24. The second pattern part B is formed relatively thick. Although a high dry etching ratio is applied to a later dry etching process, an over-etching of a passivation layer 160 formed in the first stepped portion 22 and the second stepped portion 24 may be prevented. Therefore, a metallic pattern formed under passivation layer 160 may be protected by the second pattern part B.

As mentioned the above, in accordance with the present invention, when a photoresist pattern is formed to pattern a passivation layer in a manufacturing process using three masks, a photoresist film is formed relatively thick corresponding to a stepped portion formed on a storage line. Although a high dry etching ratio is applied in a later dry etching process, an over-etching of the passivation layer on the stepped portion may be prevented. Therefore, a metallic pattern formed under the passivation layer may be protected, so that a short-circuit defect between a pixel electrode and a metallic pattern may be prevented.

Although the exemplary embodiments of the present invention have been described, it is understood that various changes and modifications will be apparent to those skilled in the art and may be made without, however, departing from the spirit and scope of the present invention.

What is claimed is:

1. A method of manufacturing a display substrate, comprising:
   forming a first metallic pattern including a gate line, a storage line and a gate electrode of a switching device on a base substrate;
   forming a gate insulation layer, a channel layer and a source metallic layer on the base substrate having the first metallic pattern formed thereon;
   patterning the source metallic layer and the channel layer to form a second metallic pattern and a channel part including a source line, a source electrode of the switching device and a drain electrode of the switching device;
   forming a passivation layer and a photoresist film on the second metallic pattern;
   patterning the photoresist film through a photolithography process to form a first pattern portion corresponding to the gate line, the source line and the switching device, and a second pattern portion formed on the storage line, a portion of the second pattern portion corresponding to a stepped portion of the storage line being thicker than a remaining portion of the second pattern portion by exposing the stepped portion and the remaining portion to different amounts of light;
   etching the passivation layer and the gate insulation layer using the first pattern portion and the second pattern portion; and
   forming a pixel electrode using the first pattern portion.

2. The method of claim 1, wherein the stepped portion and the remaining portion of the second pattern portion has a lesser thickness than the first pattern portion.

3. The method of claim 2, wherein the stepped portion is formed on an edge area of the storage line.

4. The method of claim 2, wherein the drain electrode comprises a contact portion overlapped with the storage line, and the stepped portion is formed on an edge area of the contact portion.

5. The method of claim 4, wherein forming the pixel electrode comprises:
   removing the second pattern portion;
   etching the passivation layer with the remaining portion of the first pattern portion to expose the contact portion;
   coating a transparent electrode layer on the base substrate to cover the remaining portion of the first pattern portion; and removing the remaining portion of the first pattern portion to pattern the transparent electrode layer.

6. The method of claim 1, wherein a mask for patterning the photoresist layer comprises:
- a light-blocking portion corresponding to the source line, the gate line and the switching device,
- a diffraction portion corresponding to the storage line and an opening portion corresponding to a remaining area spaced apart from the first metallic pattern and the second metallic pattern, wherein the diffraction portion has a first slit pattern corresponding to the storage line and a second slit pattern corresponding to the stepped portion, and
- wherein the width of the second slit pattern is less than that of the first slit pattern.

7. The method of claim 1, wherein a mask for patterning the photoresist layer comprises:
- an opening portion transmitting light,
- a light-blocking portion blocking light,
- a transflective portion transmitting a portion of light and
- a diffraction portion diffracting a portion of light, wherein the light-blocking portion, the transflective portion and the diffraction portion correspond respectively to the source line, the storage line and the stepped portion.

8. The method of claim 1, wherein the channel layer comprises an active layer and an ohmic contact layer.

9. The method of claim 8, wherein forming the second metallic pattern and the channel part comprises:
- etching the source metallic layer using a photoresist pattern to form an electrode pattern and the source line;
- etching the channel layer using the electrode pattern and the source line;
- removing the photoresist pattern by a predetermined thickness to expose a portion of the electrode pattern;
- etching the exposed portion of the electrode pattern to form the source electrode and the drain electrode; and
- etching the ohmic contact layer using the source electrode and the drain electrode to form the channel part.

10. The method of claim 1, wherein the second pattern portion is heated to reflow in a hardening process so that the thickness of the second pattern portion is reduced.

* * * * *